US006084455A

United States Patent [19]

Matson

[11] Patent Number: 6,084,455

[45] Date of Patent: Jul. 4, 2000

[54] HIGH-SPEED CMOS LATCH

[75] Inventor: Mark D. Matson, Acton, Mass.

[73] Assignee: Digital Equipment Corporation, Maynard, Mass.

[21] Appl. No.: 09/133,235

[22] Filed: Aug. 13, 1998

[51] Int. Cl.[7] .......... H03K 3/037

[52] U.S. Cl. .......... 327/200

[58] Field of Search .......... 327/51, 55, 57, 327/199, 200–203, 208, 210–215, 219, 225, 228; 365/203, 205, 189.05, 230.08

[56] References Cited

U.S. PATENT DOCUMENTS

| | | | |
|---|---|---|---|
| 4,837,465 | 6/1989 | Rubinstein | 327/57 |
| 4,910,713 | 3/1990 | Madden et al. | 365/189 |
| 5,481,500 | 1/1996 | Reohr et al. | 365/203 |
| 5,568,077 | 10/1996 | Sato et al. | 327/199 |
| 5,825,224 | 10/1998 | Klass et al. | 327/200 |
| 5,862,085 | 1/1999 | De Lange | 365/189.07 |

OTHER PUBLICATIONS

*High–Performance, Low–Power Design Techniques for Dynamic to Static Logic Interface*, J. Jiang, K. Lu, and U. Ko, Proceedings of the 1997 International Symposium on Low Power Electronics and Design, Aug. 18–20, 1997, pp. 12–17.

Chuang, Ching–Te et al., "SOI for Digital CMOS VLSI: Design Considerations and Advances," Proceedings of the IEEE, 86(4): 689–720 (Apr. 1998).

Glasser, Lance A., and Dobberpuhl Daniel W., "The Design and Analysis of VLSI Circuits," (MA: Addison–Wesley Publishing), pp. 286–289 (1985).

Matson, M. et al., "A 600MHz Superscalar Floating Point Processor," Paper on EV6 Fbox given at European Solid–State Circuits Conference (Sep. 1998).

Montanaro, James et al., "A 160–MHz, 32–b, 0.5–W CMOS RISC Microprocessor," IEEE Journal of Solid–State Circuits, 31(11) 1703–1714 (Nov. 1996).

*Primary Examiner*—My-Trang Nuton
*Attorney, Agent, or Firm*—Cesari & McKenna, LLP

[57] ABSTRACT

A high-speed CMOS latch includes at each storage node a pull-up P-transistor with its gate tied to a dynamic node, and a pull-down N-transistor with its gate controlled by the inverse of the states of the remaining dynamic nodes. The P-transistor drives the storage node high to VDD, and the N-transistor drives the node low to VSS, as appropriate. During evaluation, one dynamic node discharges to a low state and in response each storage node is driven relatively quickly to the desired high or low state through either the associated pull-up or pull-down transistor. Precharging P-transistors drive the dynamic nodes high during precharge periods. As the dynamic nodes go high, they turn off all of the pull-up and pull-down transistors that drive the latch storage nodes, and the latch retains the evaluated state of the dynamic nodes until the start of the next evaluation cycle. Accordingly, the latch does not require a separate clock.

6 Claims, 4 Drawing Sheets

OUT_L
OUT_H
10
22
20
LAT_H
LAT_L
18
16
P1
N1
VSS
N2
P2
VDD
VDD
28
30
VSS
26
24
31
29
27
25
32
34
12
14
VDD
VDD
36
38
DYN_L
DYN_H
INPUTS
42
N TRANSISTOR NETWORK
44
COMPLEMENTARY N TRANSISTOR NETWORK
EVAL_H
40

HIGH-SPEED CMOS LATCH

FIELD OF INVENTION

The invention relates generally to latches and, in particular, to high-speed CMOS latches.

BACKGROUND OF THE INVENTION

For high speed performance, CMOS circuit designers often implement various functions using “dynamic logic,” that is, logic that includes circuit nodes which are not always held to the supply voltage VDD (high) or ground VSS (low). The nodes are alternatively “precharged,” to drive them each to a predetermined state, for example, to a high state, and then evaluated under the control of an evaluation signal that is, in turn, controlled by a system clock. During the evaluation period, that is, when the evaluation signal is, for example, high, one of these nodes may change state, in this example, discharge to a low state, in response to the current state of one or more input signals that are associated with the nodes. For convenience, these nodes are hereinafter referred to as “dynamic nodes.”

Often the evaluated state of the dynamic nodes must be captured by a latch, before the results are passed on to receiving circuitry. For high-speed applications, the latch must be able to capture the evaluated state relatively quickly. Otherwise, the circuits that utilize the evaluated information will in turn be delayed. This may result in a slow down of the entire system if the latch is part of a critical signal path.

There are generally two constraints to the design of the latch, namely, the area, or “chip real estate,” the latch may consume and the available power. Known prior latch designs that satisfy stringent area and/or power constraints are relatively slow. For example, cross-coupled NAND gate latches have slow-falling output delays. A known prior dual cross-coupled NAND gate latch operates relatively quickly, but requires properly timed input signals for fast operation. Further, the latch requires additional logic, which increases both the area and the power consumed by the latch.

SUMMARY OF THE INVENTION

The invention is a high-speed CMOS latch that includes at each storage node a pull-up P-transistor with its gate tied to a dynamic node, and a pull-down N-transistor with its gate controlled by the inverse of the states of the remaining dynamic nodes. The P-transistor drives the output node high to VDD, and the N-transistor drives the node low to VSS, as appropriate. During evaluation, one dynamic node discharges to a low state and in response the associated P-transistor drives one output node high, while the remaining output nodes are driven low by their associated N-transistors. The output nodes are thus driven relatively quickly to the full high or low states.

Precharging P-transistors drive the dynamic nodes high during the precharge periods. As the dynamic nodes go high, they turn off all of the pull-up and pull-down transistors that drive the latch storage nodes, and the latch retains the evaluated state of the dynamic nodes until the start of the next evaluation cycle. Accordingly, the latch does not need to be separately clocked.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
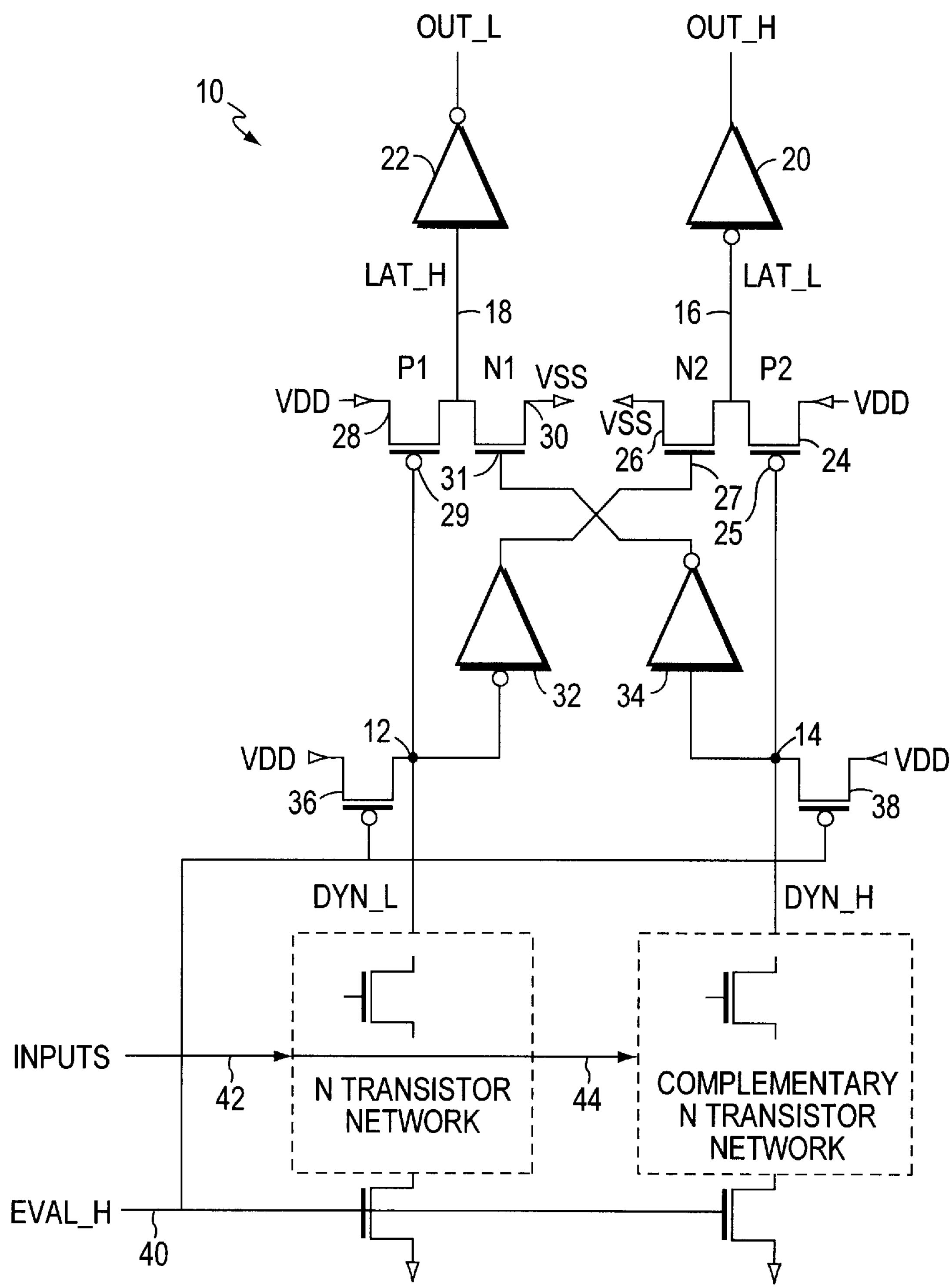
FIG. 1 depicts a latch constructed in accordance with the invention that captures the state of differential dynamic logic.

Referring to FIG. 1, a differential input latch 10 captures the states of the complementary dynamic nodes 12 and 14 at latch storage nodes 16 and 18, and provides associated signals to receiving circuitry (not shown) through inverters 20 and 22. The latch storage nodes are driven high to VDD through P-transistors 24 and 28, and low to VSS through N-transistors 26 and 30. The storage nodes thus relatively quickly produce the high and low signals required to capture the evaluated state of the dynamic nodes.

The gate 25 of the P-transistor 24 is tied to the dynamic node 14, and thus, the P-transistor is turned on or off depending on whether the dynamic node is low or high. The gate 27 of the associated N-transistor 26 is tied through an inverter 32 to the dynamic node 12, and thus, the N-transistor is turned on or off depending on whether that dynamic node is high or low. The gate 29 of the P-transistor 28 is tied to the dynamic node 12, while the gate 31 of the N-transistor 30 is tied through an inverter 34 to the dynamic node 14, and thus, they too are controlled by the states of the dynamic nodes. When the dynamic nodes have complementary states during the evaluation period, one of the storage nodes is driven high to VDD through the associated P-transistor and the other storage node is at the same time driven low to VSS through the associated N-transistor, as discussed in more detail below.

Two precharging P-transistors 36 and 38 drive the dynamic nodes 12 and 14 high to VDD during the precharge period. When the dynamic nodes are high, the P-transistors 24 and 28 and the N-transistors 26 and 30 that drive the storage nodes are all turned off. The storage nodes 16 and 18 then capacitively retain the states to which they were driven, that is, they retain the evaluated state of the dynamic nodes, until the transistors that drive the storage nodes are selectively turned on when one of the dynamic nodes changes state during the next evaluation period.

The precharging transistors 36 and 38 are controlled by an evaluation signal on line 40. The evaluation signal goes low to start a precharge period, and turns on the precharging transistors. The evaluation signal then goes high to start an evaluation period, and turns off the precharging transistors.

When the evaluation signal on line 40 goes high to signal the next evaluation period and the precharging P-transistors 36 and 38 turn off, the dynamic nodes are no longer held to VDD. The nodes are instead controlled by the true and complementary input signals on lines 42 and 44. In response to these signals, one of the dynamic nodes discharges or goes low. The discharging dynamic node turns on the associated P-transistor and through an inverter the associated N-transistor, to drive one storage node high and the other storage node low.

If, for example, dynamic node 12 goes low during the evaluation period, the associated P-transistor 28 and the N-transistor 26 turn on. The P-transistor 28 drives the storage node 18 high to VDD, while the N-transistor 26 drives the storage node 16 low to VSS. The storage nodes 16 and 18 thus relatively quickly capture the current state of the dynamic nodes 14 and 12. During the evaluation period the signal on node 12 is the complement of the signal on node 14, and thus, in the example, the signal on node 14 is high. Capactive storage essentially holds the dynamic node 14 to its precharged high state, which prevents the associated P-transistor 24 and the N-transistor 30 from turning on.

As discussed, the storage nodes 16 and 18 retain their state when the dynamic nodes 14 and 12 are both driven high during a next precharge period, and all four of the pull-up and pull-down transistors 24, 26, 28 and 30 are turned off. As soon as one of the dynamic nodes falls in response to the state of the input signals during a next evaluation period, however, two of the transistors, one pull-up and one pull-down, turn on and the storage nodes are again driven high and low to capture the next evaluated state of the dynamic nodes.

Figure 2:
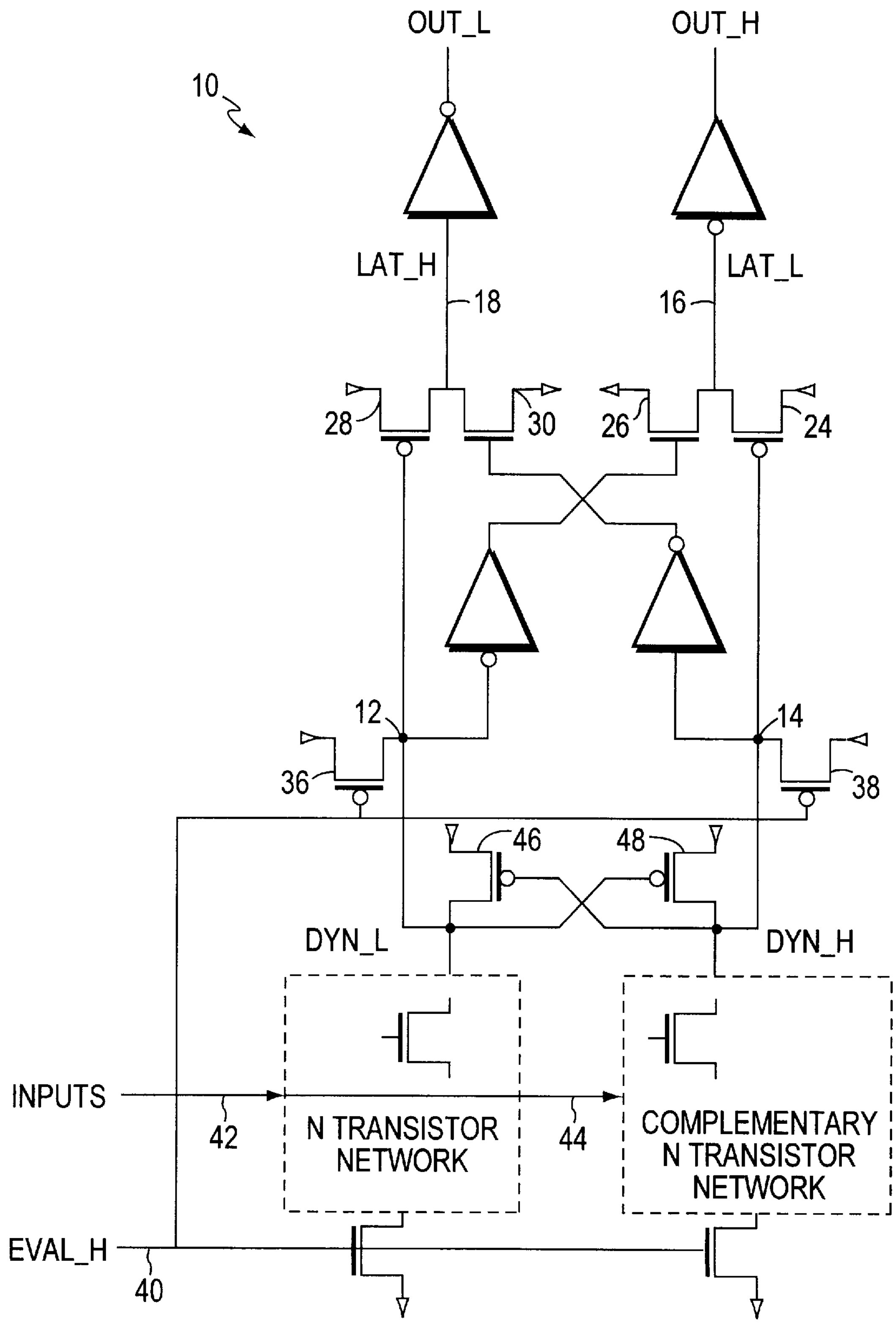
FIG. 2 depicts the latch of FIG. 1 with additional components that provide the dynamic nodes with protection from electrical disturbances.

Referring now to FIG. 2, the latch 10 includes additional cross-coupled P-transistors 46 and 48 with gates tied, respectively, to the dynamic nodes 14 and 12. The transistors provide protection to the dynamic nodes from electrical disturbances. When, for example, the dynamic node 12 is pulled low during the evaluation period in response to the state of the input signal on line 42, the P-transistor 48 turns on and holds the dynamic node 14 to VDD. Conversely, when the dynamic node 14 is pulled low, the P-transistor 46 turns on to hold the dynamic node 12 to VDD. The P-transistors 46 and 48 turn off during the precharge period, when both of the dynamic nodes are driven high to VDD by the precharge P-transistors 36 and 38.

Figure 3:
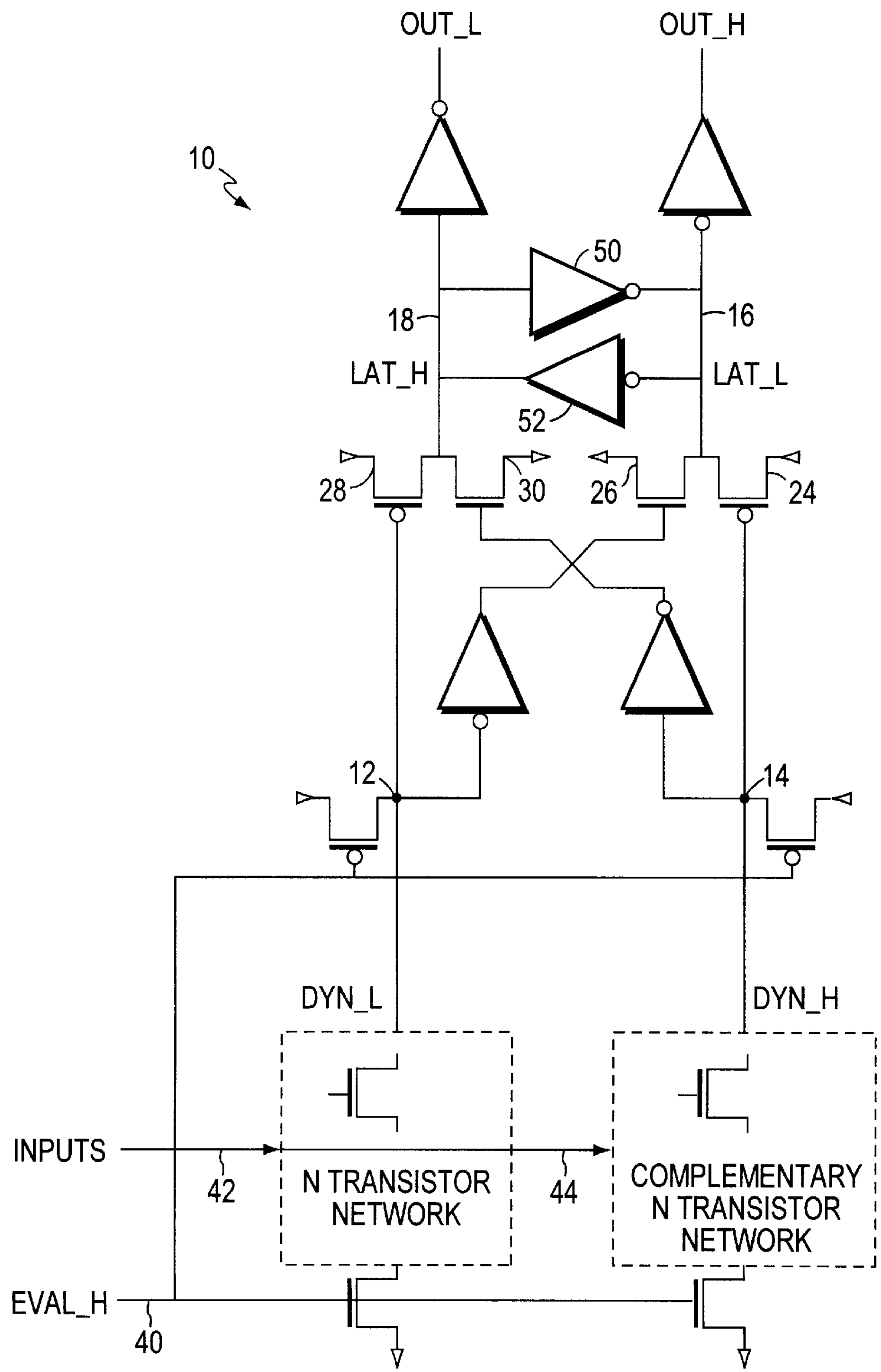
FIG. 3 depicts the latch of FIG. 1 with additional components that prevent charge from leaking off of the latch storage nodes.

FIG. 3 depicts the latch 10 with additional inverters 50 and 52 that cross-couple the latch storage nodes 16 and 18. The inverters 50 and 52 essentially prevent charge from leaking off of the nodes, by supplying to each node a signal that is the complement of the state of the other node. If the node 18 is driven low, for example, the inverter 50 provides to the node 16 a high signal that retains that node at the desired high state. At the same time the node 18 is provided with a low signal through the inverter 52, to hold the node at the desired low state. In certain applications, the latch 10 will have both the inverters 50 and 52 and the P-transistors 46 and 48 (FIG. 2).

As discussed, the latch 10 may be connected to any subsystem that drives the dynamic nodes 12 and 14 to complementary states during the evaluation period, and otherwise drives the nodes high. Indeed, the latch 10 may be connected to any subsystem that drives input nodes to complementary states for evaluation and to predetermined high states otherwise, the nodes 12 and 14 thus need not be "dynamic."

Figure 4:
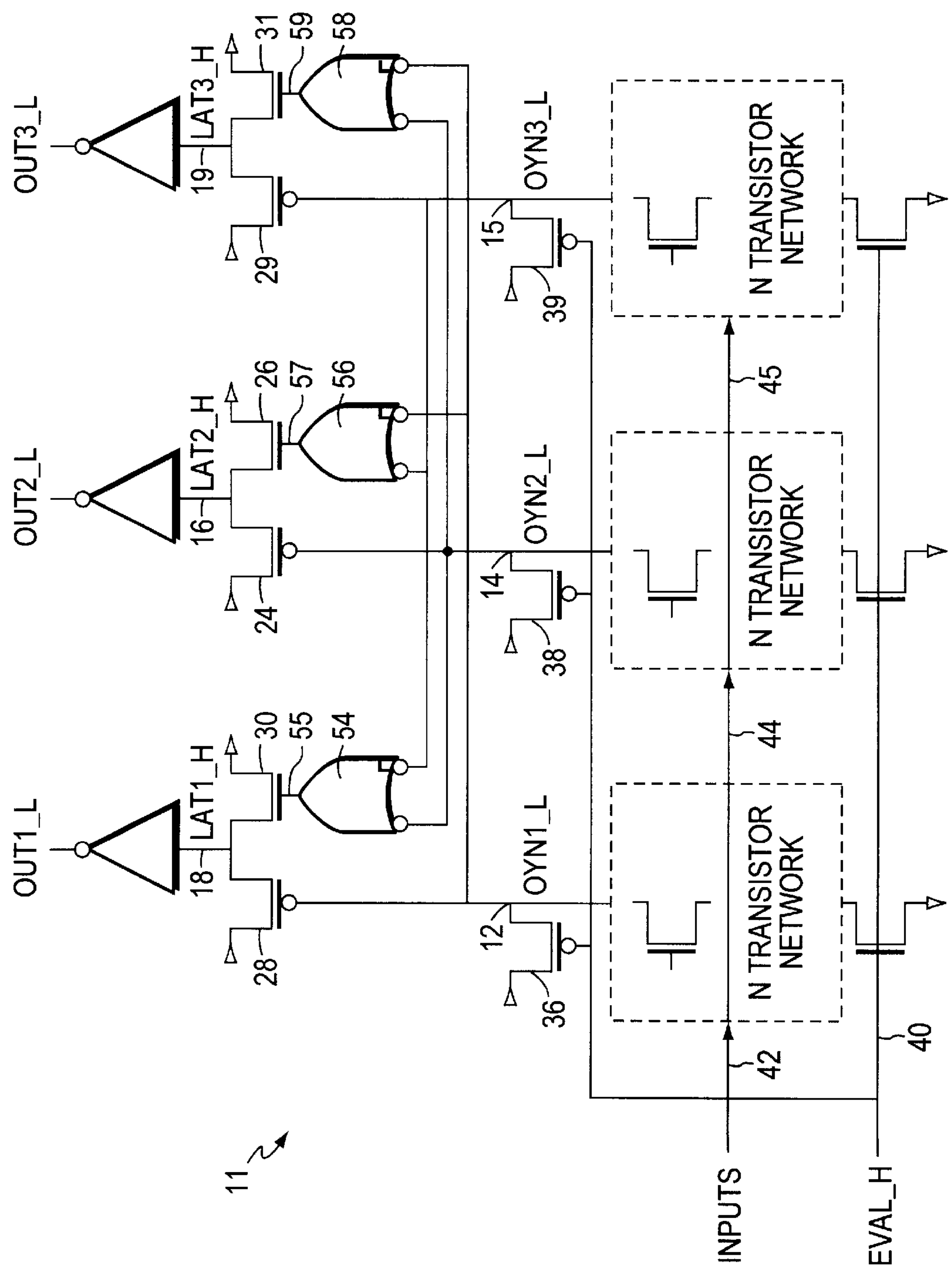
FIG. 4 depicts a latch constructed in accordance with the invention that captures the states of more than two dynamic nodes.

FIG. 4 depicts a latch 11 that captures the evaluated state of three dynamic nodes 12, 14 and 15, when one of the dynamic nodes goes low during an evaluation period. The latch 11 includes precharging P-transistors 36, 38 and 39 that precharge the dynamic nodes to a high state when the evaluation signal on line 40 goes low to signal the start of the precharge period. The latch further includes pull-up P-transistors 24, 28 and 29 that, respectively, drive the storage nodes high to VDD, and pull-down N-transistors 26, 30 and 31 that drive the storage nodes low to VSS, as appropriate during the evaluation period.

The gate of each pull-up P-transistor 24, 28 and 29 is tied, respectively, to a dynamic node 14, 12 and 15. Accordingly, when a dynamic node, for example node 15, goes low during the evaluation period, the associated P-transistor 29 is turned on to drive the storage node 19 high to VDD. The gate of the N-transistor 31 that drives the storage node 19 is tied by a NAND gate 58 to the dynamic nodes 12 and 14. The dynamic nodes remain high during the evaluation period, and thus, the NAND gate 58 prevents the N-transistor 31 from turning on.

The gate of the N-transistor 30 that is associated with the storage node 18 is tied to a NAND gate 54 that is, in turn, tied to the dynamic nodes 14 and 15. In the example, the dynamic node 15 goes low and the dynamic node 14 remains high during the evaluation period. In response, the NAND gate 54 produces a high signal on line 55 to turn the N-transistor 30 on and drive the storage node 18 low to VSS. Similarly, the gate of the N-transistor 26 is tied to a NAND gate 56 that is, in turn, tied to the dynamic nodes 12 and 15. When the dynamic node 15 goes low and the dynamic node 12 remains high, the NAND gate 56 produces a high signal on line 57, which turns on the N-transistor 26. The N-transistor 26 then drives the storage node 16 low to VSS.

During the precharge periods, the NAND gates each receive two high input signals from the precharged dynamic nodes. The NAND gates thus produce low signals on the lines 55, 57 and 59 and turn off the respective N-transistors 30, 26 and 31. The P-transistors 28, 24 and 29 with their gates tied to the dynamic nodes are similarly turned off during the precharge period, when the dynamic nodes are driven high. The latch 11 thus retains the evaluated state of the dynamic nodes through the subsequent precharge period.

The latch 11 can be extended to capture the evaluated state of any number of dynamic nodes by associating each storage node with a pull-up P-transistor that has its gate tied to a dynamic node and a pull-down transistor that has its gate controlled by the inverse of the states of the remaining dynamic nodes.

The extended latch 11, like the differential latch 10, need not be separately clocked since it captures the evaluated state of the dynamic nodes as soon as of the nodes goes low during the evaluation period and retains the evaluated state when the dynamic nodes are driven high during the subsequent precharge period.

As is evident to those skilled in the art, the latch 10 may be constructed with transistors that are the complements of the transistors depicted in, for example, FIG. 1. This latch will respond to the complementary states of the nodes 12 and 14 by driving one storage node 16 or 18 low to VSS and the remaining nodes high to VDD through, respectively, an N-transistor that is controlled by the state of one of the nodes 12 and 14 and P-transistors that are controlled by the state of the other node 12 or 14.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A CMOS latch, comprising:

a first pair of transistors and second pair of transistors, each of the pairs of transistors including one respective transistor of one conductivity type and another respective transistor of another conductivity type that is opposite to the one conductivity type, each respective pair of transistors being connected to each other at a respective storage node having a respective logic level, the respective transistors of the one conductivity type also being connected to a first logic level, the respective transistors of the another conductivity type also being connected to a second logic level that is complementary to the first logic level, each of the respective gates of the respective transistors of the one conductivity type in each respective pair of transistors being connected to a respective dynamic node of a pair of dynamic nodes, each of the respective gates of the respective transistors of the another conductivity type in each respective pair of transistors being connected to the other respective dynamic node of the pair of dynamic nodes via a respective inverter.

2. A latch according to claim 1, wherein each of the respective dynamic nodes is connected to a respective precharging transistor, the respective precharging transistors controlling respective logic states of the respective dynamic nodes based upon application of a control signal to the gates of the respective precharging transistors.

3. A latch according to claim 1, further comprising two additional inverters having respective inputs and outputs, the respective inputs of the additional inverters being connected to respective storage nodes, the respective outputs of the additional inverters being outputs of the latch.

4. A latch according to claim 1, further comprising two additional inverters having respective inputs and outputs, the respective input of one of the two additional inverters being connected to one of the respective storage nodes, the respective output of the one additional inverter being connected to the other of the respective storage nodes, the respective input of the other of the two additional inverters being connected to the other of the respective storage nodes, the respective output of the other of the two additional inverters being connected to the one respective storage node.

5. A latch according to claim 1, further comprising an additional transistor configured to drive one of the respective dynamic nodes to a respective logic level that is opposite to a respective logic level of the other of the respective dynamic nodes.

6. A CMOS latch, comprising:

a plurality of pairs of transistors, each of the pairs of transistors including one respective transistor of one conductivity type and another respective transistor of another conductivity type that is opposite to the one conductivity type, each respective pair of transistors being connected to each other at a respective storage node having a respective logic level, the respective transistors of the one conductivity type also being connected to a first logic level, the respective transistors of the another conductivity type also being connected to a second logic level that is complementary to the first logic level, each of the respective gates of the respective transistors of the one conductivity type in each respective pair of transistors being connected to a respective dynamic node of a plurality of dynamic nodes, each of the respective gates of the respective transistors of the another conductivity type in each respective pair of transistors being connected to the other respective dynamic nodes of the plurality of dynamic nodes via a respective NAND gate.

* * * * *